(12) United States Patent
Kang et al.

(10) Patent No.: US 10,095,591 B2
(45) Date of Patent: Oct. 9, 2018

(54) TEST CIRCUIT FOR 3D SEMICONDUCTOR DEVICE AND METHOD FOR TESTING THEREOF

(71) Applicant: INDUSTRY-ACADEMIC COOPERATION FOUNDATION, YONSEI UNIVERSITY, Seoul (KR)

(72) Inventors: Sung Ho Kang, Seoul (KR); In Geol Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 107 days.

(21) Appl. No.: 15/291,172

(22) Filed: Oct. 12, 2016

(65) Prior Publication Data

US 2017/0300392 A1  Oct. 19, 2017

(30) Foreign Application Priority Data

Apr. 18, 2016 (KR) .................. 10-2016-0046987

(51) Int. Cl.
*G06F 11/16* (2006.01)
*G01R 31/317* (2006.01)
(Continued)

(52) U.S. Cl.
CPC .... *G06F 11/1608* (2013.01); *G01R 31/31703* (2013.01); *G01R 31/31816* (2013.01);
(Continued)

(58) Field of Classification Search
CPC ............ G06F 11/1608; G01R 31/3177; G01R 31/31703; G01R 31/31816; G01R 31/318513; G01R 31/318335; G11C 29/40
See application file for complete search history.

(56) References Cited

U.S. PATENT DOCUMENTS 8,612,814 B1 * 12/2013 Tan ................. G11C 29/52
714/732
2002/0125907 A1 * 9/2002 Kurtulik ............ G01R 31/3185
324/750.3

(Continued)

FOREIGN PATENT DOCUMENTS

JP            201182448 A      4/2011

OTHER PUBLICATIONS

B. Keller and T. Bartenstein, "Use of MISRs for compression and diagnostics," IEEE International Conference on Test, 2005., Austin, TX, 2005, pp. 9 pp. 743.*
T. R. Damarla, M. J. Chung, Wei Su and G. T. Michael, "Faulty chip identification in a multi chip module system," Proceedings of 14th VLSI Test Symposium, Princeton, NJ, 1996, pp. 254-259.*

(Continued)

*Primary Examiner* — Cynthia Britt
(74) *Attorney, Agent, or Firm* — Sughrue Mion, PLLC

(57) ABSTRACT

Disclosed herein is a test circuit for a 3D semiconductor device for detecting soft errors and a method for testing thereof. The test circuit includes a first Multiple Input Signature Register (MISR) disposed in a first semiconductor chip, the first MISR compressing a first test result signal corresponding to a test pattern, a second MISR disposed in a second semiconductor chip stacked on or under the first semiconductor chip, the second MISR compressing a second test result signal corresponding to the test pattern, and a first error detector to detect a soft error by comparing a first output signal output from the first MISR with a second output signal output from the second MISR.

10 Claims, 5 Drawing Sheets

(51) Int. Cl.
*G11C 29/40* (2006.01)
*G01R 31/3181* (2006.01)
*G01R 31/3185* (2006.01)
*G01R 31/3183* (2006.01)

(52) U.S. Cl.
CPC ...... *G01R 31/318513* (2013.01); *G11C 29/40* (2013.01); *G01R 31/318335* (2013.01)

(56) References Cited

U.S. PATENT DOCUMENTS

| | | | | |
|---|---|---|---|---|
| 2003/0110428 A1* | 6/2003 | Ochoa | ................ | G01R 31/2884 714/724 |
| 2008/0148117 A1* | 6/2008 | Seuring | .......... | G01R 31/318561 714/726 |
| 2009/0119559 A1 | 5/2009 | Foutz et al. | | |
| 2010/0095173 A1* | 4/2010 | Rahman | ......... | G01R 31/318547 714/729 |
| 2010/0180168 A1* | 7/2010 | Ward | ............. | G01R 31/318566 714/726 |
| 2015/0260792 A1 | 9/2015 | Drapala et al. | | |

OTHER PUBLICATIONS

Communication dated May 26, 2017 from the Korean Intellectual Property Office in corresponding Korean Patent Application No. 10-2016-0046987.

Yassine Fkih, et al., "A 3D IC BIST for pre-bond test of TSVs using Ring Oscillators", International New Circuits and Systems Conference, Paris, France. IEEE, 11th International NEWCAS Conference, Jun. 2013, pp. 1-4.

Alodeep Sanyal, et al., "A Built-In Self-Test Scheme for Soft Error Rate Characterization", 14th IEEE International On-Line Testing Symposium, Jul. 2008, pp. 65-70.

* cited by examiner

TEST CIRCUIT FOR 3D SEMICONDUCTOR DEVICE AND METHOD FOR TESTING THEREOF

CROSS-REFERENCE TO RELATED APPLICATION

This application claims the priority benefit of Korean Patent Application No. 10-2016-0046987, filed on Apr. 18, 2016 in the Korean Intellectual Property Office, the disclosure of which is incorporated herein by reference.

BACKGROUND OF THE INVENTION

Field of the Invention

Embodiments of the present disclosure relates to a test circuit for a 3D semiconductor device for detecting soft errors and a method for testing thereof.

Description of the Related Art

As the process is miniaturized, devices are reduced in size, and thus the probability of occurrence of soft errors increases. To prevent the soft errors, logic designs robust to the soft errors needs have been provided and research has been conducted on a technique for correcting errors using hardware and time redundancy.

To examine the various researches for prevention of soft errors, a technique for measuring soft errors is required. Failure in Time (FIT), which is the unit of measurement of a soft error rate (SER), represents the frequency of occurrence of errors in billion time units. Since the event very rarely occurs, the frequency of occurrence of errors needs to be measured while the device is used for a very long time. However, since this requires a considerable amount of cost for tests, a hardware architecture for detection of soft errors using built-in self test (BIST) has been researched.

FIG. 1 is a diagram illustrating configuration of a test circuit (BIST) provided in a typical 2D semiconductor device 10. Referring to FIG. 1, the test circuit configured to detect a soft error includes a pattern generator to generate a test pattern and a response analyzer.

The test circuit includes a linear feedback shift register (LFSR) 11, which is a kind of test pattern generator, n scan chains 12a, 12b, 12c and 12d connected to the LFSR 11, and first and second multiple-input signature register (MISR) 13a and 13b to receive and compress test result signals.

The test circuits conduct twin tests using the first and second MISRs 13a and 13b provided in a 2D semiconductor device 10 which is a single semiconductor chip. That is, the LFSR 11 applies the same test pattern twice, wherein a test result signal for the test pattern input for the first time is stored in the first MISR 13a, and a test result signal for the test pattern input for the second time is stored in the second MISR 13b. At this time, the two signals stored in the first and second MISRs 13a and 13b are compared. If the signals are different from each other, a soft error is detected.

The test circuit shown in FIG. 1 needs two MISRs 13a and 13b in the 2D semiconductor device 10 to detect soft errors. This configuration does not cause a severe problem in the 2D semiconductor device configured by one semiconductor chip. However, if the configuration is applied to a 3D semiconductor device having multiple semiconductor chips stacked one on another, hardware overhead increases, and the test time also increases since two MISRs need to be provided for every chip. In particular, attention has been increasingly drawn to 3D semiconductor devices, and thus there is a need for a test technology to efficiently detect soft errors of the 3D semiconductor devices.

RELATED DOCUMENTS

Patent Document

U.S. patent application Ser. No. 11/933,853, "Distributed test compression for integrated circuits"

Non-Patent Document

Proc. IEEE Int. On-Line Test. Symp., July 2008, pp. 65-70, "A Built-In Self-Test Scheme for Soft Error Rate Characterization"

International New Circuits and Systems Conference, June 2013, Paris, France. IEEE, 11th International NEWCAS Conference, "A 3D IC BIST for pre-bond test of TSVs using Ring Oscillators"

SUMMARY OF THE INVENTION

Therefore, the present invention has been made in view of the above problems, and it is an object of the present invention to provide a test circuit capable of efficiently detecting soft errors of a 3D semiconductor device by providing one MISR for every chip and detecting even hardware errors through repetition of a test and a method for testing thereof.

In accordance with an aspect of the present invention, the above and other objects can be accomplished by the provision of a test circuit for a 3-dimensional (3D) semiconductor device, the test circuit including a first Multiple Input Signature Register (MISR) disposed in a first semiconductor chip, the first MISR compressing a first test result signal corresponding to a test pattern, a second MISR disposed in a second semiconductor chip stacked on or under the first semiconductor chip, the second MISR compressing a second test result signal corresponding to the test pattern, and a first error detector to detect a soft error by comparing a first output signal output from the first MISR with a second output signal output from the second MISR.

The first error detector may be electrically connected to one of the first MISR and the second MISR via a Through Silicon Via (TSV), the TSV being disposed inside one of the first semiconductor chip and the second semiconductor chip and between the first semiconductor chip and the second semiconductor chip.

The first error detector may include a comparator to compare the first output signal with the second output signal, and a soft error rate (SER) counter to detect the soft error of the first and second semiconductor chips when the first output signal is different from the second output signal.

The test circuit may be provided in each of the first and second semiconductor chip and further include a linear feedback shift register (LFSR) to generate the test pattern, and a plurality of scan chains to store the test pattern input thereto.

The test circuit may further include a third MISR disposed in a third semiconductor chip stacked on or under the first semiconductor chip, the third MISR compressing a third test result signal corresponding to the test pattern. In this case, the first error detector may detect the soft error by comparing the first output signal, the second output signal and the third output signal.

The first error detector may be electrically connected to at least two of the first MISR, the second MISR and the third MISR via a plurality of Through Silicon Vias (TSVs), the TSVs being disposed inside one of the first to third semiconductor chips and among the first to third semiconductor chips.

The test circuit may further include a third MISR disposed in a third semiconductor chip, the third MISR compressing a third test result signal corresponding to a test pattern, a fourth MISR disposed in a fourth semiconductor chip stacked on or under the third semiconductor chip, the fourth MISR compressing a fourth test result signal corresponding to the test pattern, and a second error detector to detect a soft error by comparing a third output signal output from the third MISR with a fourth output signal output from the fourth MISR.

In accordance with another aspect of the present invention, there is provided a method for testing of a 3-dimensional (3D) semiconductor device, including compressing a first test result signal corresponding to a test pattern, using a first Multiple Input Signature Register (MISR) disposed in a first semiconductor chip, compressing a second test result signal corresponding to the test pattern, using a second MISR disposed in a second semiconductor chip stacked on or under the first semiconductor chip, and detecting a soft error by comparing a first output signal output from the first MISR with a second output signal output from the second MISR.

The detecting of the soft error may include comparing the first output signal with the second output signal, and detecting the soft error of the first and second semiconductor chip when the first output signal is different from the second output signal.

The method may further include compressing a third test result signal corresponding to the test pattern, using a third MISR disposed in a third semiconductor chip stacked on or under the first semiconductor chip in this case, the detecting of the soft error may include comparing the first output signal, the second output signal, and the third output signal.

The method may further include compressing a third test result signal corresponding to the test pattern, using a third MISR disposed in a third semiconductor chip, compressing a fourth test result signal corresponding to the test pattern, using a fourth MISR disposed in a fourth semiconductor chip stacked on or under the third semiconductor chip, and detecting a soft error by comparing a third output signal output from the third MISR with a fourth output signal output from the fourth MISR.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Wherever possible, the same reference numbers will be used throughout the drawings to refer to the same or like parts.

Although terms of elements used in this specification have been selected from general ones widely used in the art, the terms may be changed depending on development and/or change of technology, practices, and preferences of the engineers. The over, the terms used herein should not be understood as limiting the scope of the present invention but as being an exemplary terms description of the embodiments.

Some terms have been arbitrarily selected by the applicant and their meanings are explained in the following description as needed. Thus, the terms used in this specification should be interpreted based on the overall content of this specification together with the actual meanings of the terms rather than their simple names or meanings.

Terms including ordinal numbers such as first, second, etc. may be used to explain various components, but the constituents are not limited thereto. These terms are used only for the purpose of distinguishing one constituent from another.

In the description of embodiments, when one film, layer, region, or element is referred to as being "on" another film, layer, region, or element, the term "on" includes both the meanings of "directly" and "indirectly".

Figure 1:
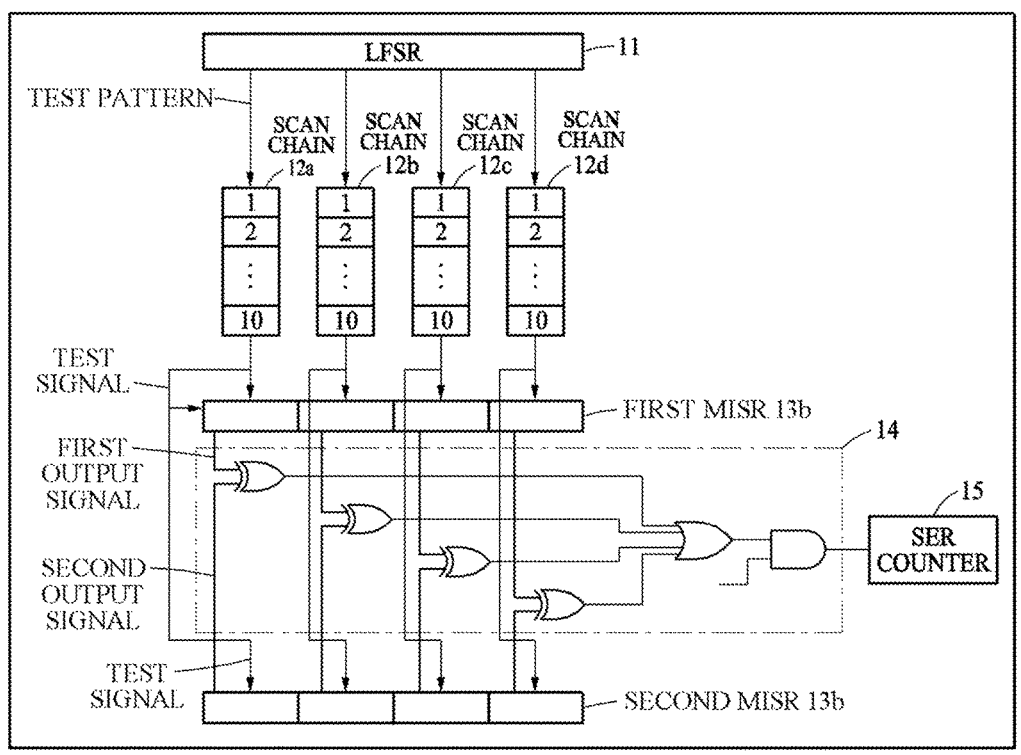
FIG. 1 is a diagram illustrating configuration of a test circuit provided in a typical 2D semiconductor device.
Figure 2:
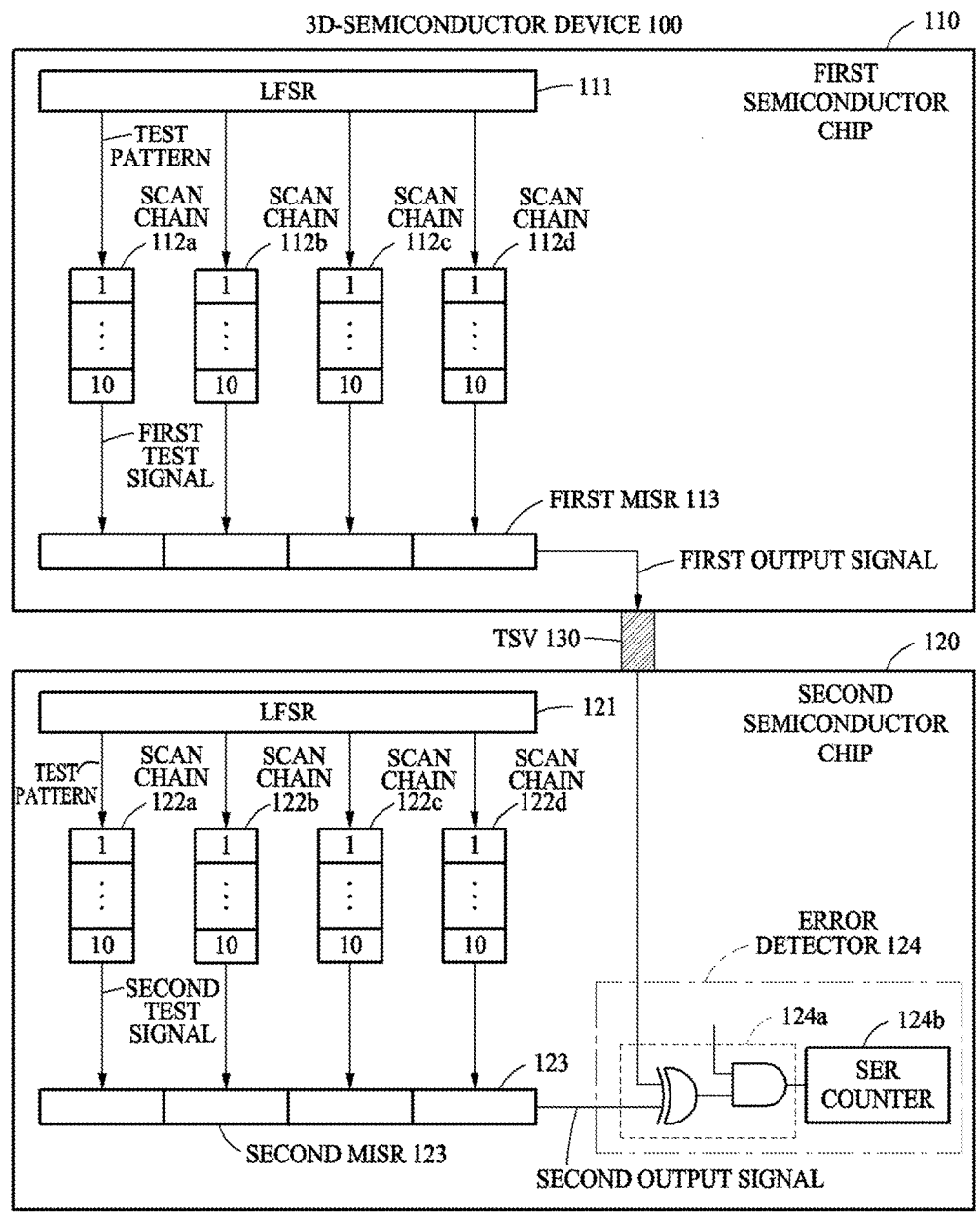
FIG. 2 is a diagram illustrating configuration of test circuits provided in a 3D semiconductor device according to an embodiment of the present invention.

FIG. 2 is a diagram illustrating configuration of test circuits provided in a 3D semiconductor device according to an embodiment of the present invention. A 3-dimensional (3D) semiconductor device 100 includes first and second semiconductor chips 110 and 120, which are stacked vertically. The first and second semiconductor chips 110 and 120 are electrically connected to each other via a Through Silicon Via (TSV) 130 disposed therebetween.

Each of the first and second semiconductor chips 110 and 120 may include a built-in test circuit to detect a soft error using the technique of built in self test (BIST). Herein, the test circuit provided in the first semiconductor chip 110 includes a linear feedback shift register (LFSR) 111 to generate a test pattern, first to fourth scan chains 112a, 112b, 112c and 112d, and a first Multiple Input Signature Register (MISR) 113.

The LFSR 111 generates a test pattern for detection of a soft error in the first semiconductor chip 110. The LFSR 111 may generate a test pattern using a pseudo-random pattern, or using a reseeding technique of pre-calculating a seed value and loading the calculated seed value onto the LFSR 111.

The first to fourth scan chains 112a, 112b, 112c and 112d receive the test pattern generated by the LFSR 111. Each of the first to fourth scan chains 112a, 112b, 112c and 112d may consist of multiple scan cells 1, 2, . . . , 10, and receive input data corresponding to the test pattern by moving from one scan cell to another. In this case, it is scan chain serves as a scan path along which the test pattern moves.

Once one test pattern is fully input to the first to fourth scan chains 112a, 112b, 112c and 112d, a first test result signal corresponding to the test pattern may be output through the first to fourth scan chains 112a, 112b, 112c and 112d.

The first MISR 113 outputs a first output signal by compressing the first test the result signal.

The test circuit included in the second semiconductor chip 120 also includes a Linear Feedback Shift Register (LFSR) 121 to generate a test pattern, first to fourth scan chains 122a, 122b, 122c and 122d, a second MISR 123, and an error detector 124.

The LFSR 121, the first to fourth scan chains 122a, 122b, 122c and 122d, and the second MISR 123 are in the second semiconductor chip 120 and operate in the same manner as the elements of the test circuit included in the first semiconductor chip 110.

When a second test result signal corresponding to the test pattern is output by the first to fourth scan chains 122a, 122b, 122c and 122d, the second MISR 123 outputs a second output signal by compressing the second test result signal. Herein, the test pattern is preferably identical to the test pattern employed to detect a soft error in the first semiconductor chip 110.

The error detector 124 receives the first output signal output from the first MISR 113 and the second output signal output from the second MISR 123. In this case, the first output signal may be received by the TSV 130 disposed between the first semiconductor chip 110 and the second semiconductor chip 120.

The error detector 124 detects a soft error by comparing the first output signal with the second output signal using a comparator 124a and an SER counter 124b.

The comparator 124a compares the first output signal with the second output signal. If the first output signal is different from the second output signal according to a comparison result output from the comparator 124a, the SER counter 124b outputs an error signal, determining that a soft error has occurred in the first and second semiconductor chips 110 and 120.

In other words, the first semiconductor chip 110 and the second semiconductor chip 120 are tested simultaneously by generating the same test pattern through the LFSRs 111 and 121, and the first output signal and the second output signal output from the first and second MISR 113 and 123 are compared with each other using an XOR gate included in the comparator 124a.

The comparator 124a includes the XOR gate to receive the first output signal and the second output signal and an AND gate to receive the output value of the XOR gate and an enable signal. Specifically, if the first output signal has the same bit value as that of the second output signal, the XOR gate outputs "0". Otherwise, the XOR gate outputs "1". The AND gate receives the output value of the XOR gate and an enable signal and outputs an output value for detection of an error. For example, if "1" is input as the enable signal when the output value of the XOR gate is "0", the AND gate outputs "0". On the other hand, if "1" is input as the enable signal when the output value of the XOR gate is "1", the AND gate outputs "1".

The SER counter 124b detects a soft error using the output value output through the comparator 124a. That is, when "1" is counted in the output value, the SER counter 124b determines that a soft error has occurred in the first and second semiconductor chips 110 and 120.

According to the test circuits shown in FIG. 2, since one MISR is included in each of the semiconductor chips 110 and 120, hardware overhead may be reduced. Further, since the same test pattern is applied to the test circuits provided in the semiconductor chips 110 and 120, the two test circuits may perform the test simultaneously. Thereby, the test time may be reduced almost by half.

In this embodiment, when a soft error is counted in the SER counter 124b, the aforementioned test may be repeated once for the first and second the semiconductor chips 110 and 120. While the soft error is not repeatedly detected when the test is repeated, a hard error may be repeatedly detected when the test is performed again since the hardware error results from defects of the hardware. Accordingly, if a soft error is detected by the test circuits in a test, the test may be performed again to identify whether the error is a soft error or a hardware error.

Although the error detector 124 is described and illustrated as being included in the second semiconductor chip 120 in FIG. 2, the error detector 124 only needs to be disposed in one of the first and second the semiconductor chips 110 and 120 to be tested to receive the first and second output signals from the two MISRs 113 and 123. Accordingly, the error detector 124 may be included in the first semiconductor chip 110.

Figure 3:
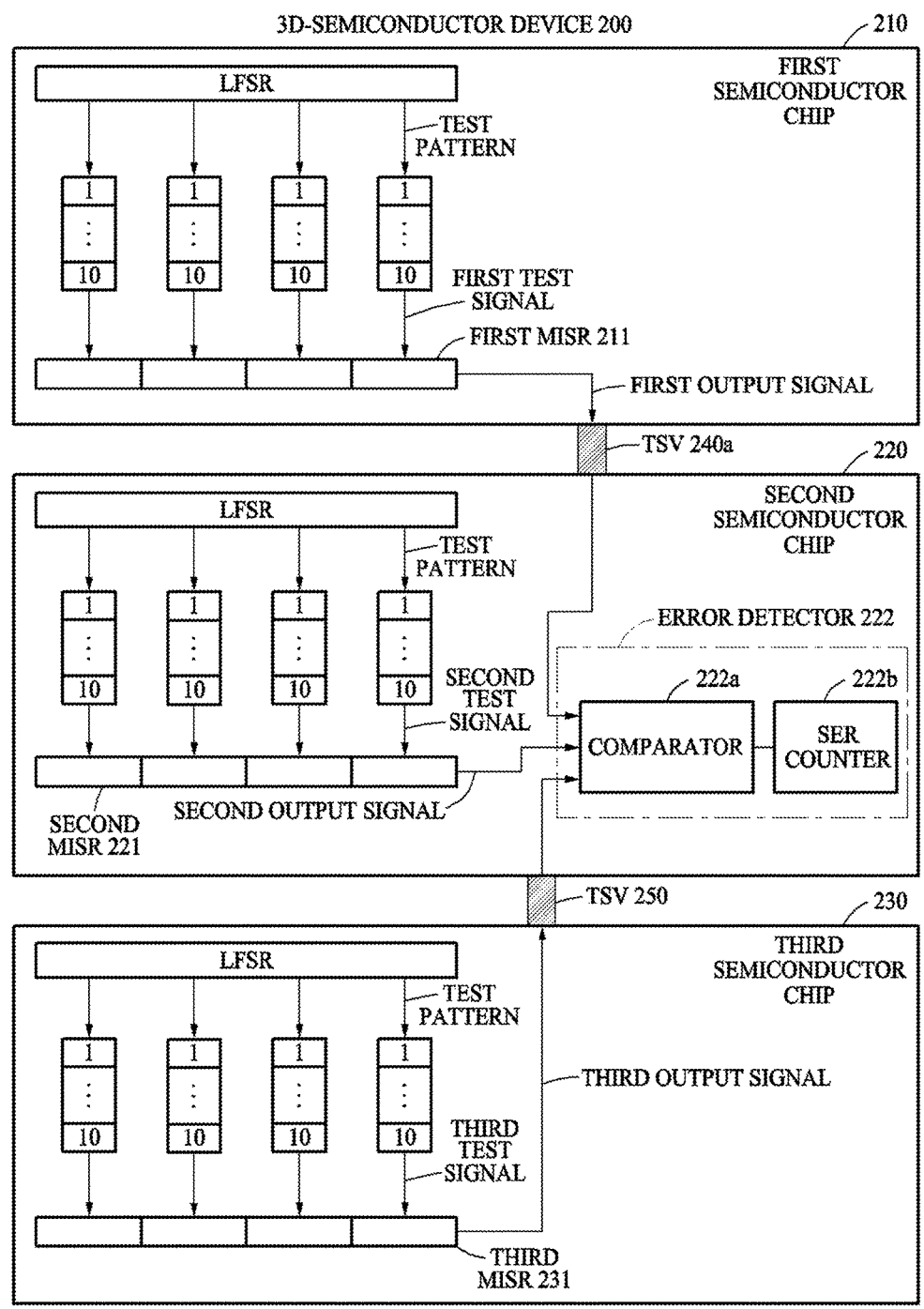
FIG. 3 is a diagram illustrating configuration of test circuits provided in a 3D semiconductor device according to another embodiment of the present invention.

FIG. 3 is a diagram illustrating configuration of test circuits provided in a 3D semiconductor device according to another embodiment of the present invention. In FIG. 3, a 3D semiconductor device 200 includes three semiconductor chips 210, 220 and 230. The first semiconductor chip 210 and second semiconductor chip 220 include the same test circuits as those of the 3D semiconductor device 100 illustrated in FIG. 2 and perform the same test operation as illustrated in FIG. 2.

In brief, the first and second semiconductor chips 210 and 220 detect a soft error using test circuits provided therein. Each of the test circuits includes an LFSR to generate a test pattern, a plurality of scan chains, and one MISR. That is, the test circuit provided in the first semiconductor chip 210 includes a first MISR 211, and the test circuit provided in the second semiconductor chip 220 includes a second MISR 221.

The first MISR 211 compresses a first test result signal corresponding to a test pattern, and the second MISR 221 compresses a second test result signal corresponding to a test pattern. The same test pattern may be applied to the test circuits simultaneously.

In this embodiment, the 3D semiconductor device 200 may further perform the test operation for a third semiconductor chip 230. Specifically, the third semiconductor chip 230 includes an LFSR, a plurality of scan chains and a third MISR 231.

The third MISR 231 compresses a third test result signal corresponding to a test pattern. Test pattern may be the same as the test pattern for the first MISR 211 and the second MISR 221. In contrast with the first semiconductor chip 210 and the second semiconductor chip 220, the third semiconductor chip 230 further includes an error detector 222. The error detector 222 receives a first output signal output from the first MISR 211, a second output signal output from the second MISR 221, and a third output signal output from the third MISR 231.

Herein, the error detector 222 may be electrically connected to the first semiconductor chip 210 via a TSV 240 disposed between the first semiconductor chip 210 and the second semiconductor chip 220 and electrically connected to the third semiconductor chip 230 via the TSV 250 disposed between the second semiconductor chip 220 and the third semiconductor chip 230. Accordingly, the error detector 222 may receive the first to third output signals from the first to third MISRs 211, 221 and 231, and compare the output signals to detect a soft error.

The error detector 222 detects a soft error by comparing the first to third output signals using a comparator 222a and an SER counter 222b. Specifically, if the bit values output from the first to third output signals is all "0" or "1", then the comparator 222a may output "0". Otherwise, the comparator 222a may output "1".

The SER counter 222b detects a soft error using an output value output through the comparator 222a. That is, if the output value output through the comparator 222a is "1", the SER counter 222b may detect a soft error in the first to third the semiconductor chips 210, 220 and 230.

According to the embodiment illustrated in FIG. 3, the same pattern may be applied to the test circuits provided in the first to third the semiconductor chip 210, 220 and 230 to detect a soft error.

In particular, as the soft error is detected in the three semiconductor chips 210, 220 and 230 simultaneously by one error detector 222, hardware overhead for the test may be reduced and the test time may also be reduced.

If the soft error is detected by the error detector 222, the test circuits shown in FIG. 3 may repeat the aforementioned test once for the first to third the semiconductor chips 210, 220 and 230. By repeating the test, a hardware error may be detected in the first to third the semiconductor chips 210, 220 and 230.

While the error detector 222 is described and illustrated as being disposed in the second semiconductor chip 220, the error detector 222 only needs to be disposed in one of the first to third the semiconductor chips 210, 220 and 230 to be tested to receive output signals from the three MISRs. Accordingly, the error detector 222 may be included in the first semiconductor chip 210 or in the third semiconductor chip 230.

Figure 4:
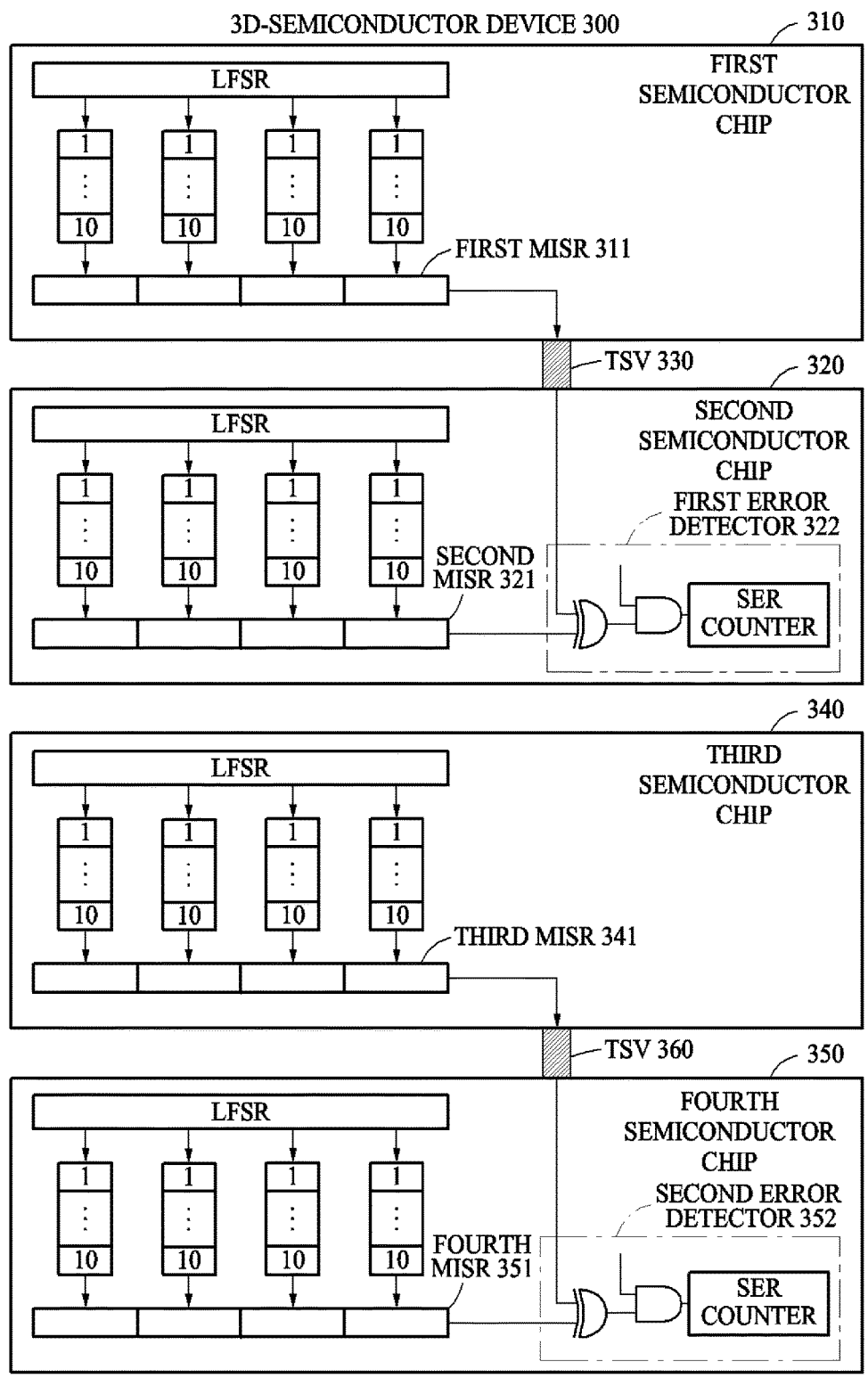
FIG. 4 is a diagram illustrating configuration of test circuits provided in a 3D semiconductor device according to yet another embodiment of the present invention.

FIG. 4 is a diagram illustrating configuration of test circuits provided in a 3D semiconductor device according to yet another embodiment of the present invention. In FIG. 4, a 3D semiconductor device 300 includes four semiconductor chips 310, 320, 340 and 350. Herein, every two semiconductor chips may be grouped into one test set. Thereby, a first semiconductor chip 310 and a second semiconductor chip 320 may be grouped into a first test set, and a third semiconductor chip 340 and a fourth semiconductor chip 350 may be grouped into a second test set.

The first semiconductor chip 310, second semiconductor chip 320, third semiconductor chip 340 and fourth semiconductor chip 350 include the same test circuits as those of the 3D semiconductor device 100 illustrated in FIG. 2, and perform the same test operation as illustrated in FIG. 2.

In brief, each of the first to fourth semiconductor chips 310, 320, 340 and 350 detects a soft error using test circuits provided therein. Each of the test circuits includes an LFSR to generate a test pattern, a plurality of scan chains, and one MISR 311, 321, 341, 351. Further, the test circuit provided in the second semiconductor chip 320 includes a first error detector 322, and the test circuit provided in the fourth semiconductor chip 350 includes a second error detector 352.

The first error detector 322 may detect soft errors in the first and second semiconductor chips 310 and 320 via a TSV 330 using a first output signal output from the first MISR 311 and a second output signal output from the second MISR 321.

The second error detector 352 may detect soft errors in the third and fourth semiconductor chips 340 and 350 via a TSV 360 using a third output signal output from a third MISR 341 and a fourth output signal output from a fourth MISR 351.

According to the test circuits shown in FIG. 4, since one MISR is provided in each of the semiconductor chip 310, 320, 340 and 350, hardware overhead is reduced. In addition, since every two test circuits are provided with one error detector 351, 352 for detection of a soft error, corresponding hardware overhead may also be reduced. In particular, as the number of semiconductor chips constituting the 3D semiconductor device 400 increases, the effect of reduction in hardware overhead may be enhanced.

Figure 5:
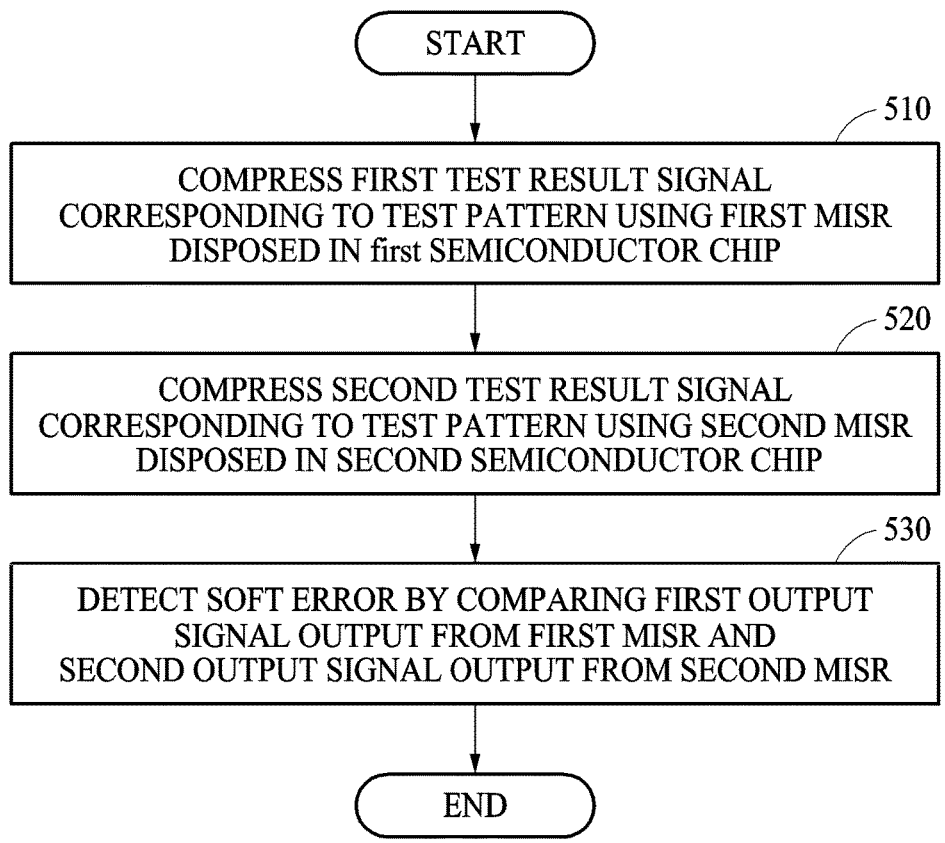
FIG. 5 illustrates a method for testing a 3D semiconductor device according to an embodiment of the present invention.

FIG. 5 illustrates a method for testing a 3D semiconductor device according to an embodiment of the present invention. The test method illustrated in FIG. 5 may be performed by the test circuits of the 3D semiconductor device 100 illustrated in FIG. 2. Herein, the 3D semiconductor device 100 includes the first and second semiconductor chips 110 and 120, and test circuits are provide in the first and second the semiconductor chips 110 and 120.

The test circuit compresses a first test result signal corresponding to a test pattern generated by an LFSR, using the first MISR 113 disposed in the first semiconductor chip 110 (step 510).

In addition, the test circuit compresses a second test result signal corresponding to a test pattern generated by an LFSR using the second MISR 123 disposed in the second semiconductor chip 120 (step 520). Herein, steps 510 and 520 may be performed simultaneously using the same pattern.

The test circuit detects a soft error by comparing a first output signal output from the first MISR 113 and a second output signal output from the second MISR 123 (step 530). Specifically, if the bit value of the first output signal is different from that of the second output signal in the comparison, it may be determined that a soft error has been detected. This operation is performed in the same way as the comparator 124a and the error detector 125b illustrated in FIG. 2 operate.

While the test method is illustrated as being performed on the 3D semiconductor device 100 including two semiconductor chips in FIG. 5, a similar test method may be applied to a 3D semiconductor device including three or more semiconductor chips.

For example, for a 3D semiconductor device including three semiconductor chips, a soft error may be detected by comparing a test result signal output from one reference MISR with test result signals output from the MISRs included in the other test circuits all at once to detect a soft error, as illustrated in FIG. 3.

Alternatively, for a 3D semiconductor device including four semiconductor chips, a soft error may be detected by grouping every two semiconductor chips into one test set and comparing test result signals output from MISRs disposed in each set of two semiconductor chips, as illustrated in FIG. 4.

Although specific embodiments of the present invention have been disclosed for illustrative purposes, it will be apparent to those skilled in the art that various modifications and variations can be made in the present invention without departing from the scope of the invention.

It should be understood that the invention is not limited to the embodiments disclosed herein. The scope of the invention should be defined only by the accompanying claims and equivalents thereof.

What is claimed is:

1. A test circuit for a 3-dimensional (3D) semiconductor device, the test circuit comprising:
   a first linear feedback shift register (LFSR) disposed in a first semiconductor chip to generate a first test pattern and provide the first test pattern to a plurality of scan chains disposed in the first semiconductor chip;
   a first Multiple Input Signature Register (MISR) disposed in the first semiconductor chip to receive a first test signal corresponding to the first test pattern and output from the plurality of scan chains disposed in the first semiconductor chip, compress the first test signal and output a first output signal corresponding to the compressed first test signal;
   a second linear feedback shift register (LFSR) disposed in a second semiconductor chip stacked on or under the first semiconductor chip to generate a second test pattern and provide the second test pattern to a plurality of scan chains disposed in the second semiconductor chip, the first test pattern and the second test pattern being the same with each other;
   a second MISR disposed in the second semiconductor chip stacked on or under the first semiconductor chip to receive a second test signal corresponding to the second test pattern and output from the plurality of scan chains disposed in the second semiconductor chip, compress the second test signal and output a second output signal corresponding to the compressed second test signal; and
   a first error detector to detect a soft error of the first and second semiconductor chips by comparing the first output signal output from the first MISR and passing through a Through Silicon Via (TSV) disposed between the first semiconductor chip and the second semiconductor chip with the second output signal output from the second MISR.

2. The test circuit according to claim 1, wherein the first error detector is electrically connected to one of the first MISR and the second MISR via the TSV, the TSV being disposed inside one of the first semiconductor chip and the second semiconductor chip.

3. The test circuit according to claim 1, wherein the first error detector comprises:
   a comparator to compare the first output signal with the second output signal; and
   a soft error rate (SER) counter to detect the soft error of the first and second semiconductor chips when the first output signal is different from the second output signal.

4. The test circuit according to claim 1, further comprising:
   a third linear feedback shift register (LFSR) disposed in a third semiconductor chip stacked on or under the first semiconductor chip to generate a third test pattern and provide the third test pattern to a plurality of scan chains disposed in the third semiconductor chip;
   a third MISR disposed in the third semiconductor chip stacked on or under the first semiconductor chip to receive a third test signal corresponding to the third test pattern and output from the plurality of scan chains disposed in the third semiconductor chip, compress the third test signal and output a third output signal corresponding to the compressed third test signal,
   wherein the first error detector detects a soft error of the first, second and third semiconductor chips by comparing the first output signal, the second output signal and a third output signal output from the third MISR and passing through a TSV disposed between the second semiconductor chip and the third semiconductor chip.

5. The test circuit according to claim 4, wherein the first error detector is electrically connected to at least two of the first MISR, the second MISR and the third MISR via a plurality of Through Silicon Vias (TSVs), the TSVs being disposed inside one of the first to third semiconductor chips and among the first to third semiconductor chips.

6. The test circuit according to claim 1, further comprising:
   a third linear feedback shift register (LFSR) disposed in a third semiconductor chip stacked on or under the first semiconductor chip to generate a third test pattern and provide the third test pattern to a plurality of scan chains disposed in the third semiconductor chip;
   a third MISR disposed in the third semiconductor chip to receive a third test signal corresponding to the third test pattern and output from the plurality of scan chains disposed in the third semiconductor chip, compress the third test signal and output a third output signal corresponding to the compressed third test signal;
   a fourth linear feedback shift register (LFSR) disposed in a fourth semiconductor chip stacked on or under the third semiconductor chip to generate a fourth test pattern and provide the fourth test pattern to a plurality of scan chains disposed in the fourth semiconductor chip;
   a fourth MISR disposed in the fourth semiconductor chip stacked on or under the third semiconductor chip to receive a fourth test signal corresponding to the fourth test pattern and output from the plurality of scan chains disposed in the fourth semiconductor chip, compress the fourth test signal and output a fourth output signal corresponding to the compressed fourth test signal; and
   a second error detector to detect a soft error of the third and fourth semiconductor chips by comparing the third output signal output from the third MISR and passing through a TSV disposed between the third semiconductor chip and the fourth semiconductor chip with the fourth output signal output from the fourth MISR.

7. A method for testing of a 3-dimensional (3D) semiconductor device, comprising:
   generating, by a first linear feedback shift register (LFSR) disposed in a first semiconductor chip, a first test pattern and providing, by the first LFSR, the first test pattern to a plurality of scan chains disposed in the first semiconductor chip;
   receiving, by a first Multiple Input Signature Register (MISR) disposed in the first semiconductor chip, a first test signal corresponding to the first test pattern and output from the plurality of scan chains disposed in the first semiconductor chip, compressing, by the first MISR, the first test signal corresponding to the first test pattern and outputting, by the first MISR, a first output signal corresponding to the compressed first test signal;
   generating, by a second linear feedback shift register (LFSR) disposed in a second semiconductor chip stacked on or under the first semiconductor chip, a second test pattern and providing, by the second LFSR, the second test pattern to a plurality of scan chains disposed in the second semiconductor chip;
   receiving, by a second Multiple Input Signature Register (MISR) disposed in the second semiconductor chip, a second test signal corresponding to the second test pattern and output from the plurality of scan chains disposed in the second semiconductor chip, compressing, by the second MISR, a second test signal corresponding to the second test pattern and outputting, by the second MISR, a second output signal corresponding to the compressed second test signal, the first test pattern and the second test pattern being the same with each other; and detecting a soft error of the first and second semiconductor chips by comparing the first output signal output from the first MISR and passing through a Through Silicon Via (TSV) disposed between the first semiconductor chip and the second semiconductor chip with the second output signal output from the second MISR.

8. The method according to claim 7, wherein the detecting of the soft error comprises:

comparing the first output signal with the second output signal; and detecting the soft error of the first and second semiconductor chips when the first output signal is different from the second output signal.

9. The method according to claim 7, further comprising:

generating, by a third linear feedback shift register (LFSR) disposed in a third semiconductor chip stacked on or under the first semiconductor chip, a third test pattern and providing, by the third LFSR, the third test pattern to a plurality of scan chains disposed in the third semiconductor chip;

receiving, by a third Multiple Input Signature Register (MISR) disposed in the third semiconductor chip, a third test signal corresponding to the third test pattern and output from the plurality of scan chains disposed in the third semiconductor chip, compressing, by the third MISR, the third test signal corresponding to the third test pattern, outputting, by the third MISR, a third output signal corresponding to the compressed third test signal, wherein the detecting of the soft error comprises:

detecting a soft error of the first, second and third semiconductor chips by comparing the first output signal, the second output signal, and a third output signal output from the third MISR and passing through a TSV disposed between the second semiconductor chip and the third semiconductor chip.

10. The method according to claim 7, further comprising:

generating, by a third linear feedback shift register (LFSR) disposed in a third semiconductor chip stacked on or under the first semiconductor chip, a third test pattern and providing, by the third LFSR, the third test pattern to a plurality of scan chains disposed in the third semiconductor chip;

receiving, by a third Multiple Input Signature Register (MISR) disposed in the third semiconductor chip, a third test signal corresponding to the third test pattern and output from the plurality of scan chains disposed in the third semiconductor chip, compressing the third test signal corresponding to the third test pattern output from a plurality of scan chains disposed in the third semiconductor chip and outputting, by the third MISR, a third output signal corresponding to the compressed third test signal;

generating, by a fourth linear feedback shift register (LFSR) disposed in a fourth semiconductor chip stacked on or under the third semiconductor chip, a fourth test pattern and providing, by the fourth LFSR, the fourth test pattern to a plurality of scan chains disposed in the fourth semiconductor chip;

receiving, by a fourth Multiple Input Signature Register (MISR) disposed in the fourth semiconductor chip, a fourth test signal corresponding to the fourth test pattern and output from the plurality of scan chains disposed in the fourth semiconductor chip, compressing the fourth test signal corresponding to the fourth test pattern output from a plurality of scan chains disposed in the fourth semiconductor chip, and outputting, by the fourth MISR, a fourth output signal corresponding to the compressed fourth test signal; and detecting a soft error of the third and fourth semiconductor chips by comparing the third output signal output from the third MISR and passing through a TSV disposed between the third semiconductor chip and the fourth semiconductor chip with the fourth output signal output from the fourth MISR.

* * * * *